United States Patent
Binder et al.

(10) Patent No.: US 10,491,186 B2
(45) Date of Patent: Nov. 26, 2019

(54) RESONATOR AND METHOD FOR PROVIDING RESONATOR

(71) Applicant: Infineon Technologies AG, Neubiberg (DE)

(72) Inventors: Jonathan Binder, Munich (DE); Ruediger Bauder, Feldkirchen-Westerham (DE); Hans-Joerg Timme, Ottobrunn (DE)

(73) Assignee: Infineon Technologies AG, Neubiberg (DE)

(*) Notice: Subject to any disclaimer, the term of this patent is extended or adjusted under 35 U.S.C. 154(b) by 9 days.

(21) Appl. No.: 15/919,950

(22) Filed: Mar. 13, 2018

(65) Prior Publication Data
US 2018/0269847 A1    Sep. 20, 2018

(30) Foreign Application Priority Data

Mar. 14, 2017 (DE) .................. 10 2017 105 432

(51) Int. Cl.
| | | |
|---|---|---|
| *H03H 9/02* | (2006.01) | |
| *H03H 9/17* | (2006.01) | |
| *H03H 9/13* | (2006.01) | |
| *H01L 41/35* | (2013.01) | |
| *H03H 3/02* | (2006.01) | |
| *H01L 41/18* | (2006.01) | |
| *H01L 41/29* | (2013.01) | |
| *H03H 9/54* | (2006.01) | |
| *B60T 17/08* | (2006.01) | |
| *F16D 55/02* | (2006.01) | |
| *F16D 65/18* | (2006.01) | |

(52) U.S. Cl.
CPC ....... *H03H 9/02086* (2013.01); *B60T 17/085* (2013.01); *H01L 41/18* (2013.01); *H01L 41/29* (2013.01); *H01L 41/35* (2013.01); *H03H 3/02* (2013.01); *H03H 9/02015* (2013.01); *H03H 9/02118* (2013.01); *H03H 9/13* (2013.01); *H03H 9/17* (2013.01); *H03H 9/54* (2013.01); *F16D 55/02* (2013.01); *F16D 65/18* (2013.01)

(58) Field of Classification Search
CPC ......... H03H 9/54; H03H 9/02; H03H 9/02015
USPC ......................................................... 333/187
See application file for complete search history.

(56) References Cited

U.S. PATENT DOCUMENTS

| | | | | |
|---|---|---|---|---|
| 8,054,145 B2* | 11/2011 | Mohammadi | ......... | H01L 41/107 333/186 |
| 8,525,619 B1* | 9/2013 | Olsson | ............... | H03H 9/02228 310/324 |
| 9,041,492 B2* | 5/2015 | Wang | .................. | H03H 3/0072 310/324 |
| 9,419,583 B2* | 8/2016 | Rinaldi | .................... | G01J 5/20 |
| 2013/0214879 A1 | 8/2013 | Gorisse et al. | | |

(Continued)

OTHER PUBLICATIONS

German Patent Office, Office Action issued for DE 102017105432. 4, 10 pgs., dated Dec. 12, 2017.

(Continued)

*Primary Examiner* — Dean O Takaoka
(74) *Attorney, Agent, or Firm* — Schiff Hardin LLP

(57) ABSTRACT

A resonator is described including a piezoelectric material with first and second electrodes provided on the piezoelectric material. An acoustic metamaterial at least partially surrounds an active region of the resonator.

20 Claims, 7 Drawing Sheets

(56) References Cited

U.S. PATENT DOCUMENTS

2017/0201234 A1* 7/2017 Jager ................. H03H 9/02015

OTHER PUBLICATIONS

Rottenberg, et al., "Phononic Bandgap Coupled Bulk Acoustic Wave Resonators", 4 pgs., IEEE, 2012.
Rottenberg, et al., "Meta-Materials Approach to Sensitivity Enhancement of MEMS BAW Resonant Sensors", 4 pgs., IEEE, 2013.

* cited by examiner

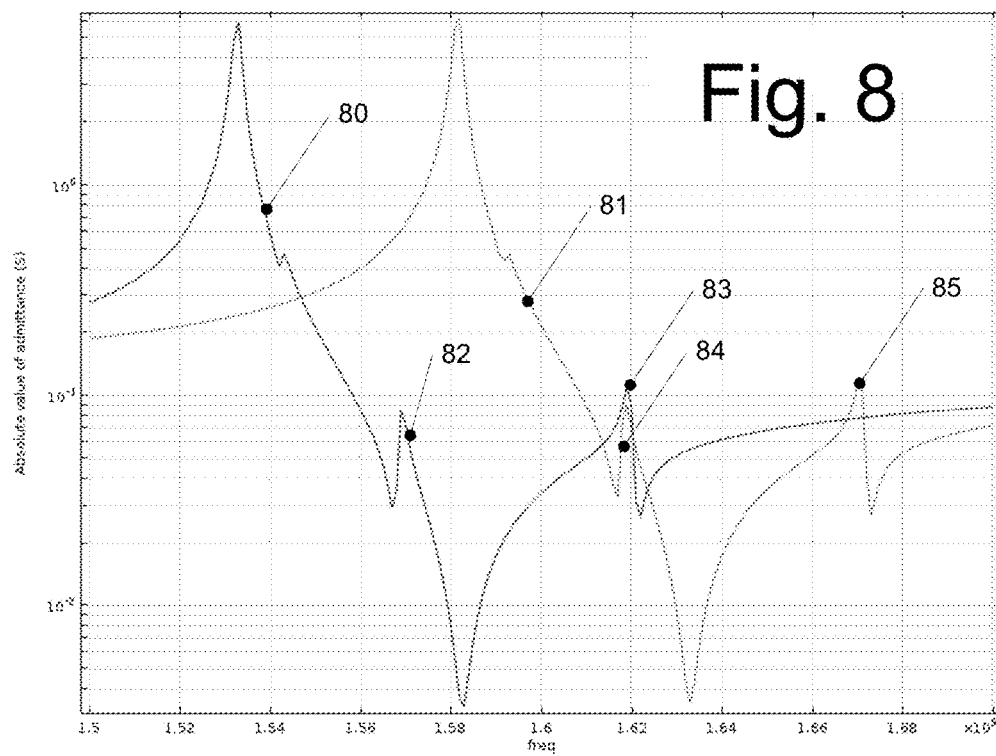
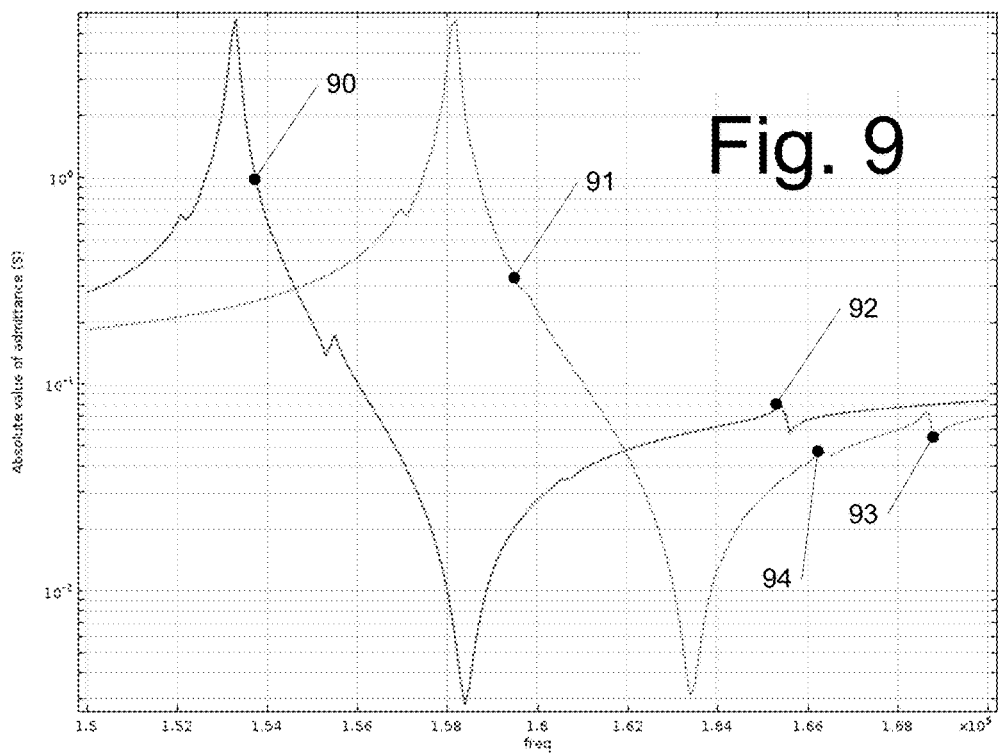

RESONATOR AND METHOD FOR PROVIDING RESONATOR

TECHNICAL FIELD

The present application relates to resonators and methods for providing such resonators.

BACKGROUND

Filters are used in a variety of electronic circuits to filter out certain frequency components of a signal while letting other frequency components pass. For example, in communication circuits filters may be used to block frequency components outside a frequency band or part of a frequency band used for communication and to be processed by further circuits.

As highly selective bandpass filters in communication circuits and devices, surface acoustic wave (SAW) or bulk acoustic wave (BAW) technologies are frequently used. Conventional filters of such types use acoustic resonators consisting of a piezoelectric material and electrodes. In BAW resonators, the piezoelectric material is sandwiched between two electrodes (e.g. top and bottom electrodes), and acoustic waves propagate through the bulk of the piezoelectric material between the electrodes (e.g. in a vertical direction, which may be referred to as z-direction). SAW resonators utilize interdigitated electrode structures on the surface of the piezoelectric material, and acoustic waves propagate along the surface of the piezoelectric (e.g. within the x-y plane).

Leakage of acoustic waves in acoustic resonators limits the quality factor of the resonator which is defined as a ratio of energy stored in the resonator and energy lost during a resonator cycle. Minimization of acoustic losses is therefore an important factor in acoustic resonator technology and design. In BAW resonators, for example, acoustic leakage can have vertical and lateral components. These loss components can be localized in an area between the electrodes, to the surrounding substrate. A filter, which is made from those resonators will therefore experience such leakage based loss mechanisms.

Furthermore, in some implementations of resonators boundary conditions at resonator edges cause the appearance of so-called spurious mode waves in a BAW resonator which result in passband ripples in a corresponding filter curve of a filter implemented using the BAW resonators. Such spurious mode waves may also cause energy leakage.

When energy is leaking from the resonator, the leaking acoustic waves may also impact adjacent resonators and interact with them in an unwanted way. This may cause uncontrolled acoustic coupling between resonators and may lead to decreased performance of filters. Generally, acoustic energy leaking from the resonator may impact other acoustic resonator devices that are located in the vicinity of the resonator.

SUMMARY

According to an embodiment, a resonator is provided, comprising:
a piezoelectric material,
a first electrode provided on a first side of the piezoelectric material,
a second electrode arranged on a second side of the piezoelectric material opposite the first side, the first and second electrodes defining an active resonator region in the piezoelectric material, e. g. a region where both electrodes overlap as seen from a direction perpendicular to the electrodes, and
an acoustic metamaterial provided to the piezoelectric material, the acoustic metamaterial at least partially surrounding the active resonator region.

According to another embodiment, a method is provided, comprising:
providing a piezoelectric material,
providing first and second electrodes on opposite side of the piezoelectric material, the first and second electrodes defining an active resonator region, and forming an acoustic metamaterial at least partially surrounding the active resonator region.

The above summary is merely intended to give a brief overview over some features of some embodiments and is not to be construed as limiting.

BRIEF DESCRIPTION OF THE DRAWINGS

FIGS. 8 to 10 show simulation results for illustrating effects of some embodiments.

DETAILED DESCRIPTION

Figure 1A:
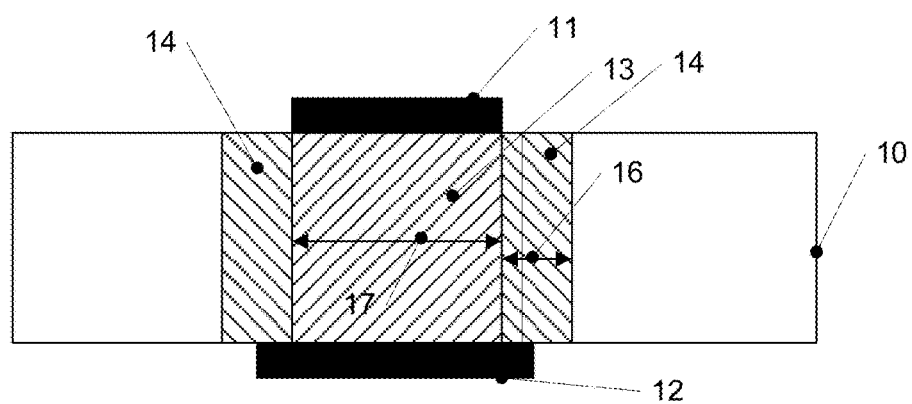
FIGS. 1A and 1B are cross-sectional views of resonators according to embodiments.

In the following, various embodiments will be described in detail referring to the attached drawings. It should be noted that these embodiments serve illustrative purposes only and are not to be construed as limiting. For example, while embodiments may be described as comprising a plurality of features, elements or details, in other embodiments some of these features, elements or details may be omitted and/or may be replaced by alternative features, elements or details. In addition to the features, elements or details explicitly described, other features, elements or details, for example components conventionally used in bulk acoustic waves (BAW) based filters and resonators, may be provided.

Features from different embodiments may be combined to form further embodiments unless noted to the contrary. Variations or modifications described with respect to one of the embodiments may also be applicable to other embodiments unless noted otherwise.

Embodiments discussed in the following relate to bulk acoustic wave (BAW) resonators, which may be used to build BAW-based filters. For forming BAW resonators, generally a piezoelectric material is provided between two electrodes. The application of an electric field between the two electrodes generates a mechanical stress that is further propagated through the bulk of the structure as an acoustic wave. A resonance condition is established when the acoustical path and thickness direction of the structure corresponds to integer multiples of half the acoustic wavelength inside the piezoelectric material. This resonance condition holds if the acoustic effect of the electrodes is neglected, i.e. for an ideal resonator, where only the piezoelectric layer is considered. Taking into account the acoustic effect of the electrodes, the resonance condition deviates from this ideal case. In this way, a filter function for signals having a certain frequency applied to the electrodes may be implemented.

An active region of the resonator may correspond to a region of the piezoelectric material between the two electrodes. For example, the active region of the resonator may be a region of the piezoelectric material where an area defined by a first electrode overlaps an area defined by a second electrode. In embodiments, the active region, which may also include some edge structures in a peripheral region thereof, is surrounded by an acoustic metamaterial having an acoustical bandgap at least partially corresponding to a frequency range of the resonator, e.g. comprising a resonance frequency of the resonator. Such acoustic metamaterials may be implemented as phononic crystals that may comprise periodic structures of two or more materials. In embodiments, one of the materials is the piezoelectric material. In embodiments, the metamaterial may be based on the piezoelectric material with modifications by at least one other material in a bulk and/or on a surface of the piezoelectric material. An acoustic metamaterial generally is a material designed to control, direct and manipulate sound waves as these might occur in gases, liquids and solids, the present application relating to sound waves in solids, i.e. bulk acoustic waves or surface acoustic waves. Example structures of metamaterials will be explained later in more detail.

Manipulation, controlling and direction of acoustic waves in acoustically active regions of a resonator or filter may for example be used on purpose to couple acoustic waves into other active regions of a resonator or filter, to create a notch characteristics of a filter response. For illustration purposes we will discuss the reduction and elimination of leakage waves out of a resonator and filter. Nevertheless, metamaterials at least partially surrounding an active region of a resonator as discussed herein in other embodiments may also be to control, direct and manipulate sound waves as described above.

Phononic crystals as mentioned above typically use structures of the size about half the acoustic wavelength of acoustic waves to be manipulated. Other acoustic metamaterials may use smaller structures, for example patterns about ten times smaller than the acoustic wavelength of acoustic waves to be manipulated.

Turning now to the Figures, FIG. 1A is a schematic cross-sectional view of a resonator according to an embodiment.

The resonator of the embodiment of FIG. 1A is built on a basis of a piezoelectric bulk material 10, for example a thin film for high-frequency applications. Examples for suitable piezoelectric materials include aluminum nitride (AlN), lithium niobate (LiNbO$_3$), potassium niobate (KNbO$_3$), scandium (Sc) doped aluminum nitride or aluminum scandium nitride (AlScN). However, other piezoelectric materials may also be used.

A first electrode 11 and a second electrode 12 are provided on opposite sides of piezoelectric material 10. As indicated in FIG. 1A, first and second electrodes 11, 12 do not need to have the same size, although this may be the case in some embodiments. For example, in the embodiment shown in FIG. 1A second electrode 12 covers a larger area than first electrode 11. In other embodiments, the electrodes may cover a same area, i.e. have a same size, or first electrode 11 may cover a larger area than second electrode 12. A region 13 of the piezoelectric material 10 between first and second electrodes 11, 12 forms an active resonator region. As illustrated in FIG. 1, the size of the active resonator region 13 is essentially determined by the smaller electrode, in case of FIG. 1A first electrode 11. More generally, the active resonator region is defined as the overlap region of the two electrodes and the piezoelectric layer.

First and second electrodes 11, 12 may be made of any electrically conducting material, for example comprising one or more metal layers or highly doped semiconductor layers, like highly doped polycrystalline silicon.

The resonator structure shown in FIG. 1A may act as part of a bandpass filter, where a signal is applied to one or both electrodes 11, 12. Depending on a thickness of the resonator corresponding to a distance between electrodes 11, 12, frequencies outside a bandpass range are attenuated by the resonator shown in FIG. 1. Any conventional filter implementation using resonators may be used.

To avoid or reduce energy leakage from the resonator, in the embodiment of FIG. 1A an acoustic metamaterial 14 is arranged at least partially surrounding active region 13. While in FIG. 1A acoustic metamaterial 14 is depicted as being provided directly adjacent to active region 13, in other embodiments metamaterial 14 may be arranged spaced apart from active region 13, as will be explained later in more detail. It should be noted that FIG. 1A is not drawn to scale, and for example a width 16 of metamaterial 14 in a direction perpendicular to the distance between electrodes 11, 12 may be significantly smaller than the width 17 of active region 13. For example, the width 16 may be approximately one to ten times the wavelength of the acoustic waves in the bandpass range, depending on the metamaterials used.

Metamaterial 14 may comprise two or more materials arranged in a periodic fashion. In embodiments, one of the materials of the two or more materials is the material of piezoelectric material 10, such that the metamaterial may be formed by introducing at least one of the materials into piezoelectric material 10, as will be explained below in more detail. Metamaterial 14 may be designed to have an acoustic bandgap corresponding to the above mentioned bandpass range, such that the frequencies within this range cannot propagate through metamaterial 14. In embodiments, metamaterial 14 may be a phononic crystal. Metamaterial 14 is located outside the active resonator region 13.

It should be noted that in some embodiments metamaterial 14 may completely surround active resonator region 13. In other embodiments, the surrounding may be partially, for example for manufacturing reasons or to deliberately leave gaps in metamaterial 14 to allow a controlled leakage of energy, for example to provide some acoustic coupling to further resonators provided in the vicinity of the resonator of FIG. 1A.

Figure 1B:
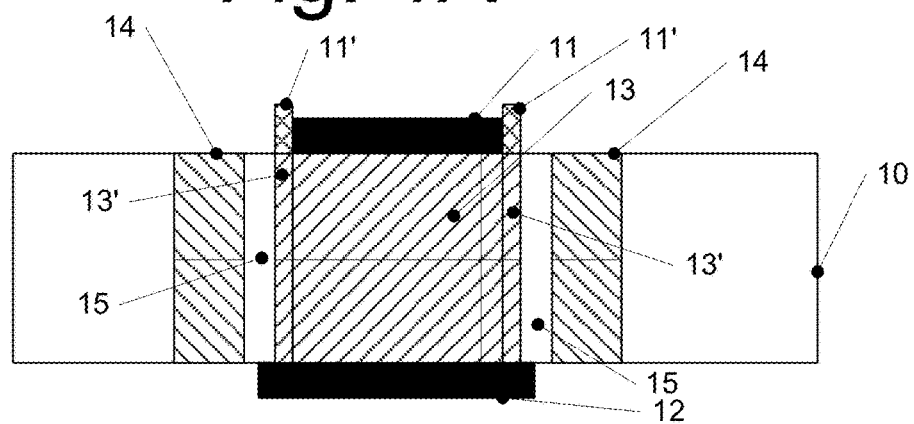

FIG. 1B illustrates a variation of the embodiment of FIG. 1A, and corresponding elements bear the same reference numerals and will not be described again in detail. Compared to FIG. 1A, the embodiment of FIG. 1B includes a region 15, which may be made of piezoelectric material 10, between the active region 13 and metamaterial 14 at least partially surrounding active region 13.

Furthermore, in the embodiment of FIG. 1B first electrode 11 is modified in a peripheral region 11' thereof along at least part of its circumference compared to a remaining region of electrode 11, i.e. electrode 11 apart from peripheral region 11'. For example, in peripheral region 11' a thickness of electrode 11 may be different, i.e. greater than or smaller than, from the remaining region, or additional material may be provided on electrode 11 in peripheral region 11'. Such additional material may be electrically conducting, e.g. a metal, or non-conducting, e.g. an oxide. Numeral 13' denotes a corresponding peripheral region of active region 13 below peripheral region 11'. Peripheral region 13' is still a part of active region 13. However, due to the modification of electrode 11 in peripheral region 13', acoustic properties like the dispersion relation and the exact resonance condition may be different in peripheral region 13' from the remaining active region 13. In this way, peripheral region 13' may be used to suppress spurious modes by means of a properly designed dispersion behavior, while metamaterial region 14 confines energy inside the resonator by preventing the propagation of lateral acoustic waves from active region 13 into piezoelectric material 10 outside active region 13 and region 15.

In other embodiments, peripheral region 13' is modified instead of or in addition to modifying electrode 11 in peripheral region 11'. For example, a trench, optionally filled with a material different from piezoelectric material 10, may be provided in region 13'.

While first electrode 11 is modified in FIG. 1B in a peripheral region thereof, in other embodiments additionally or alternatively second electrode 12 may be modified. Moreover, the two variations shown in FIG. 1B compared to FIG. 1A, namely region 15 on the one hand and peripheral regions 11', 13' on the other hand, may be implemented independently from each other.

While in FIG. 1 the metamaterial 14 extends all or almost all the way through piezoelectric materials in the z-direction, in other embodiments a metamaterial may only be arranged at or near the surfaces of piezoelectric material 10 e.g. adjacent to or spaced apart from electrodes 11, 12. This may be used to prevent the leakage of surface waves from the resonator and may allow for easy manufacturing of the resonator.

Figure 2:
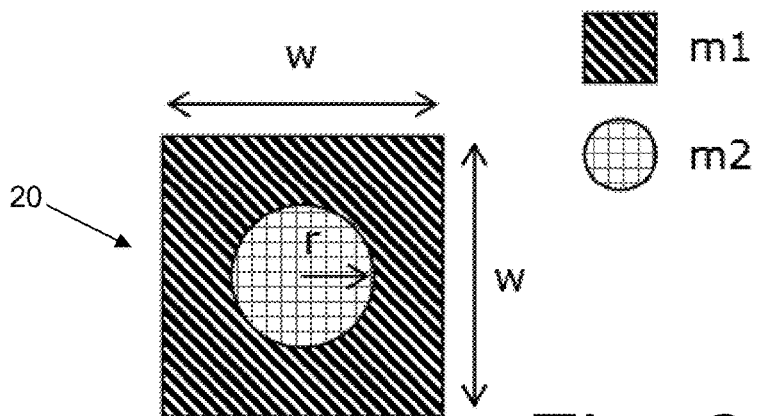
FIG. 2 is a diagram illustrating a unit cell of a metamaterial usable in some embodiments.
Figure 3:
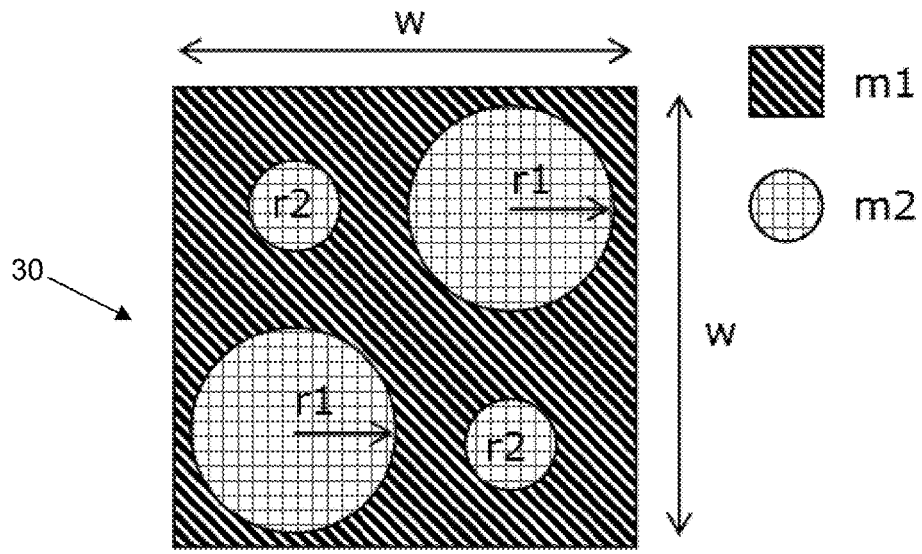
FIG. 3 is a diagram illustrating a unit cell of a metamaterial usable in some embodiments.

In embodiments, metamaterial region(s) like metamaterial 14 may be formed as/from 2D or 2.5D or 3D structures. A 2D structure at or near the surface or interface to another material alone will eliminate the propagation of surface or interface waves at the same level as the structure. FIG. 2 and FIG. 3 discussed further below illustrate 2.5D structures which are efficient to block propagation of lateral modes in any depth of the piezoelectric material. Such a 2.5D arrangement, as will be explained further below, may be formed e.g. by columns extending through the piezoelectric material. In other embodiments, a general 3D metamaterial structure may be provided. A 3D metamaterial structure can for example be realized by embedding small balls or cubes or other regions of a material in the piezoelectric material in order to create a bandgap for more general directions.

A subset of this disclosure is to realize so called grating structures for SAW resonators/filters my means of such 2D metamaterials. In contrast to the state-of-the-art grating structures, such metamaterials can created a wider frequency bandgap providing a wider frequency reflection plane.

By providing metamaterial 14 in piezoelectric material 10, the resonator remains fully solid, for example no tethers or other elastic portions provided, which in embodiments may provide for mechanical robustness of the resonator. In some embodiments, use of metamaterial structures like region 14 in FIG. 1A or 1B allows to keep the piezoelectric material or layer, e.g. piezoelectric material 10 outside the resonator structure, which in some embodiments minimizes surface topography in processing of corresponding devices in an integrated technology. This feature may for example be used in coupled resonator technologies, for example, where two or more BAW resonators are built on top of each other and coupled acoustically.

It should be noted that while a single resonator is illustrated in FIG. 1, more than one resonator may be provided in piezoelectric material 10. Metamaterial 14 then also provides decoupling of the resonators, such that they may be essentially independent from each other. Moreover, piezoelectric material 10 may be integrated with other structures, for example semiconductor electronic structures. For example, in case aluminum nitride is used as a piezoelectric material, this may be integrated for example with silicon or III-V semiconductor structures and devices. For example, the described metamaterial surrounded/embedded resonators may be combined with other devices like LNAs (Low-Noise Amplifiers), PAs (power amplifiers), radio frequency (RF) switches, passive RF components like inductors, capacitors, couplers, microelectromechanical system (MEMS) devices etc. Similarly, other circuitry like analog and digital signal processing circuits, power management circuits, control and interface circuits etc., including non-RF circuits, may be provided.

Next, referring to FIGS. 2-4 phononic crystals usable as metamaterials in embodiments will be discussed. FIG. 2 illustrates a plane view of a unit cell 20 of a phononic crystal usable in embodiments made of a first material m1 and a second material m2. FIG. 2 for example may show a view in an x-y plane in FIG. 1 of metamaterial 14. Material m1 may in some embodiments be the piezoelectric material also used for forming the resonator, for example piezoelectric material 10 of FIG. 1. Second material m2 may for example be a metal like tungsten or an oxide material like silicon dioxide. In some embodiments, material m2 is the same material as used for first electrode 11 and/or second electrode 12, thus reducing the overall number of materials needing to be processed. Second material m2 is provided centrally in the unit cell 20 with a radius r. For example, in case of the view in the x-y plane mentioned above, second material m2 may be provided as cylindrical column in piezoelectric material 10 within the region 14. Such columns may be manufactured for example by trench etching or otherwise removing piezoelectric material 10 corresponding to the column to form a trench and then filling the trench with second material m2. To form metamaterial 14, then the unit cell 20 is repeated periodically around the resonator, as will be explained further below using an example.

FIG. 3 illustrates a unit cell 30 of another phononic crystal usable in embodiments. Again, the view of FIG. 3 may be a view in an x-y plane in FIG. 1, and a second material m2 may be provided in columns in a first material m1. First material m1 may correspond to piezoelectric material 10 of FIG. 1. In case of FIG. 3, columns having different dimensions, in this case two different radii r1, r2 are provided, as shown in FIG. 3. Again, metamaterial 14 is then formed by repetition of unit cell 30 to provide a periodic structure.

It should be noted that while in FIGS. 2 and 3 circular columns are shown as examples, in other embodiments other shapes may be used. In embodiments, a cylindrically symmetric shape with a specifically designed cross-sectional area may be used. In the example shown, the cross-sectional area is a circle, and the column, which may also be referred to as pillar, is a cylinder.

In other embodiments, square shapes or a mixture of round and square shapes may be used as cross-sectional areas. Another example are triangle-shaped cross-sectional areas. Furthermore, while phononic crystals made of two different materials are shown, in other embodiments more than two materials may be used. For example, in case of FIG. 3 the columns having radius r1 may be made of a different material than the columns having radius r2. Also, more than two different radii are possible. Therefore, the phononic crystal structures explained referring to FIGS. 2 and 3 serve only as non-limiting examples. Moreover, in case only isolation of surface waves is required, the structures shown in FIGS. 2 and 3 may be provided only on the surface of piezoelectric material 10, for example by depositing a second material m2.

Figure 4:
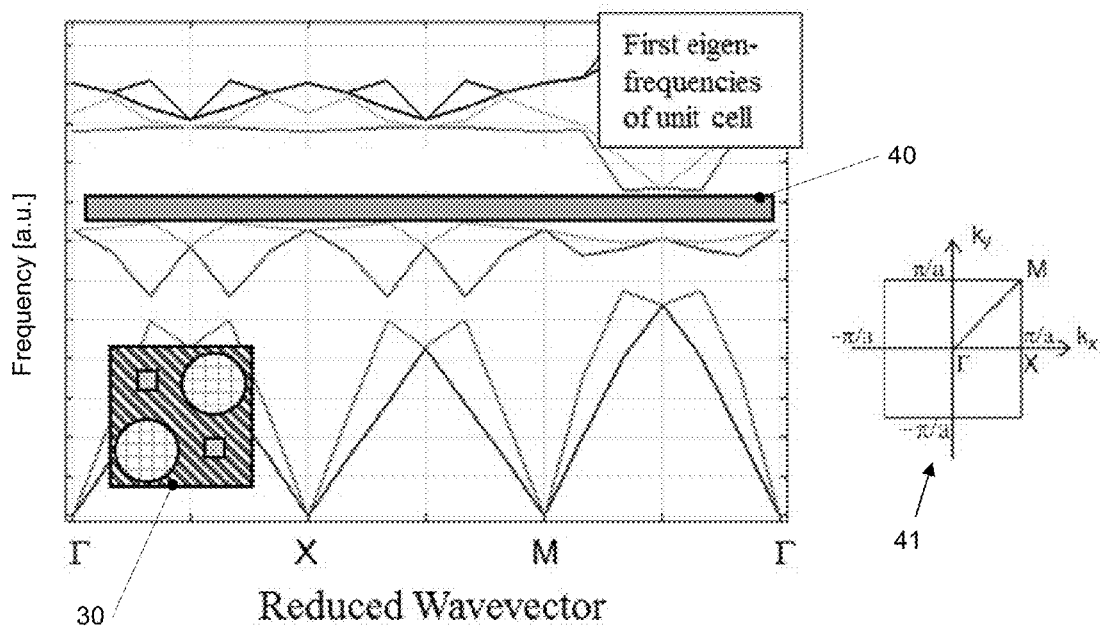
FIG. 4 is a phononic band structure of a metamaterial usable in some embodiments.

FIG. 4 illustrates an example acoustic band structure of a phononic crystal using unit cell 30 of FIG. 3. The band structure is illustrated for different directions in k-space, using the usual crystallographic designations X, N, F' as illustrated in the graph 41. FIG. 4 in particular illustrates the first eigenfrequencies of unit cell 30. As can be seen, an acoustic bandgap 40 is provided where no propagation of acoustic waves in no lateral direction is present. The dimensions, e.g. width w, radii r1, r2, of unit cell 30 may be designed such that acoustic bandgap 40 is in a desired range, for example corresponding to a frequency range of the resonator. Also based on the selection of materials m1, m2 a tuning of acoustic bandgap 40 may be obtained.

Figure 5A:
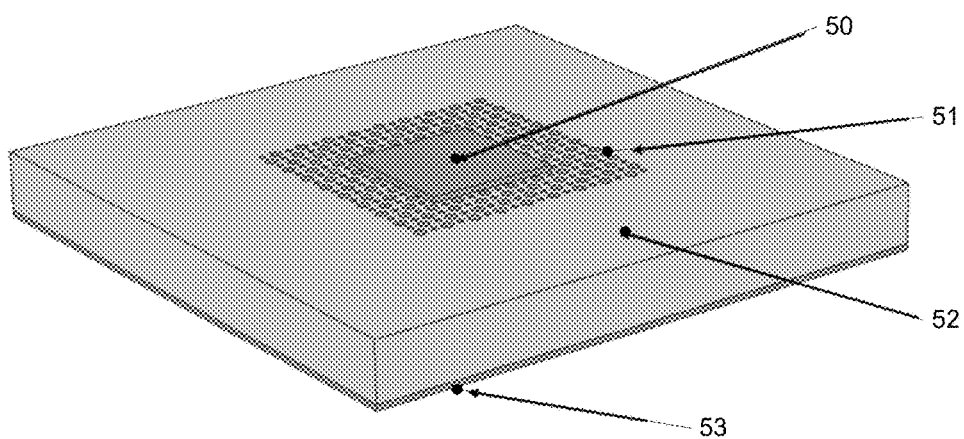
FIG. 5A is a perspective view of a resonator according to an embodiment.

Next, a resonator according to an embodiment will be discussed referring to FIGS. 5A to 5C. FIG. 5A illustrates a perspective view of the resonator, FIG. 5B illustrates an enlarged partial view of FIG. 5A, and FIG. 5C illustrates a cross-sectional view along a line A-A' in FIG. 5B.

Figure 5B:
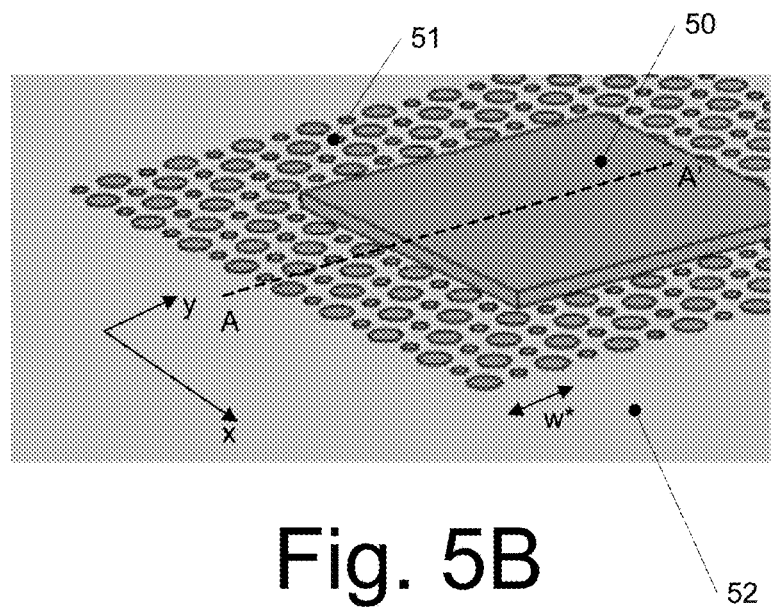
FIG. 5B illustrates an enlarged partial view of FIG. 5A.
Figure 5C:
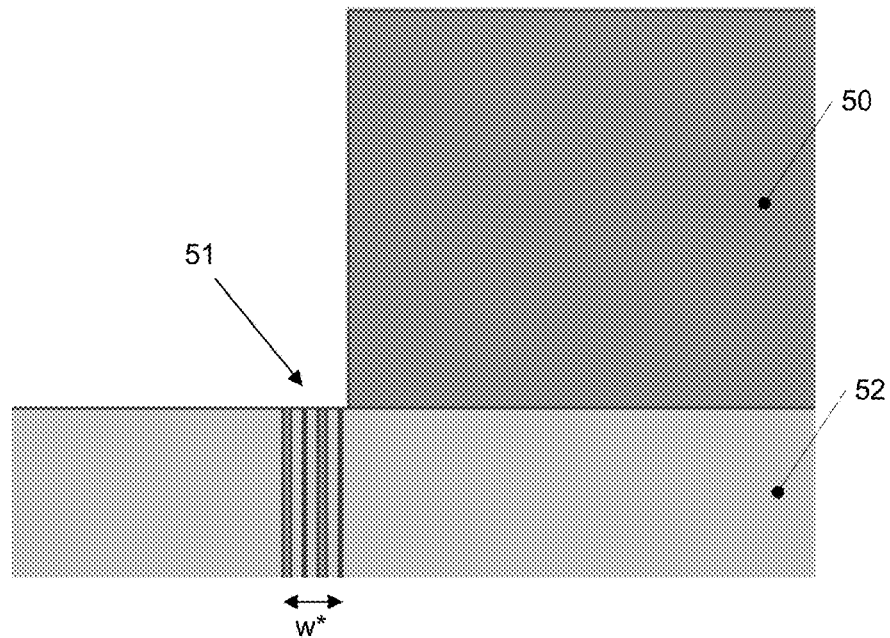
FIG. 5C illustrates a cross-sectional view essentially along a line A-A' of FIG. 5B.

In the embodiments of FIGS. 5A to 5C, a first electrode 50, also referred to as top electrode, is provided on a first side of piezoelectric material 52. A second electrode 53, also referred to as bottom electrode, is provided on a second side of piezoelectric material 52 opposite of the first side. In the example of FIG. 5A to 5C, bottom electrode 53 covers the complete backside of piezoelectric material 52, whereas first electrode 50 only covers a part of piezoelectric material 52, thus defining an active resonator region. Regarding materials, as piezoelectric material 52 and material for first and second electrodes 50, 53 the materials already discussed with reference to FIG. 1 may be used.

Furthermore, an acoustic metamaterial 51 surrounds he active resonator region of piezoelectric material 52, as can be seen in FIGS. 5B and 5C. As an example, as a metamaterial a phononic crystal having a structure based on unit cell 30 of FIG. 3 is used. The metamaterial has a width w* in y-direction, as shown in FIGS. 5B and 5C. As an example, the width w* in FIGS. 5B and 5C corresponds to two times the width w in FIG. 3 or, in other words, two repetitions of the unit cells are used surrounding first electrode 50. Generally, any number of repetitions may be used. In some embodiments, at least two repetitions are used. In some embodiments, five repetitions or less are used, as in many implementations using more repetitions does not essentially change the effect obtained by providing the metamaterial. The repetitions of the unit cells may be seen as forming a two-dimensional matrix around the active resonator region, i.e. the matrix has a "gap" for the active resonator region. The unit cell dimensions in embodiments are small compared to typical resonator sizes. When using a small number of repetitions for the metamaterial region 51 (see also the discussion of FIGS. 8, 9, and 10 below), area requirements for the metamaterial are comparatively small. It should be noted that while unit cell 30 of FIG. 3 is used to build the metamaterial in the embodiment of FIGS. 5A to 5C, in other embodiments other unit cells may be used, for example unit cell 20 discussed referring to FIG. 2.

As can be seen in the cross-sectional view of FIG. 5C, metamaterial 51 is formed by providing columns of a further material extending through piezoelectric material 52. The further material may be the same as or different from the material of top electrode 50. Using the same material in some embodiments reduces the overall number of materials to be processed and may allow for easy and cost efficient manufacturing of the resonator.

In other embodiments, instead of the periodic repetition of a unit cell as explained above so-called log-periodic structures may be used, where the size of the unit cells, e.g. width w is varied in each repetition, similar to dipoles of a log-periodic antenna for electromagnetic waves. In such log-periodic structures, the size of the embedded structures is increased with the distance in order to widen the resulting bandgap.

Figure 6:
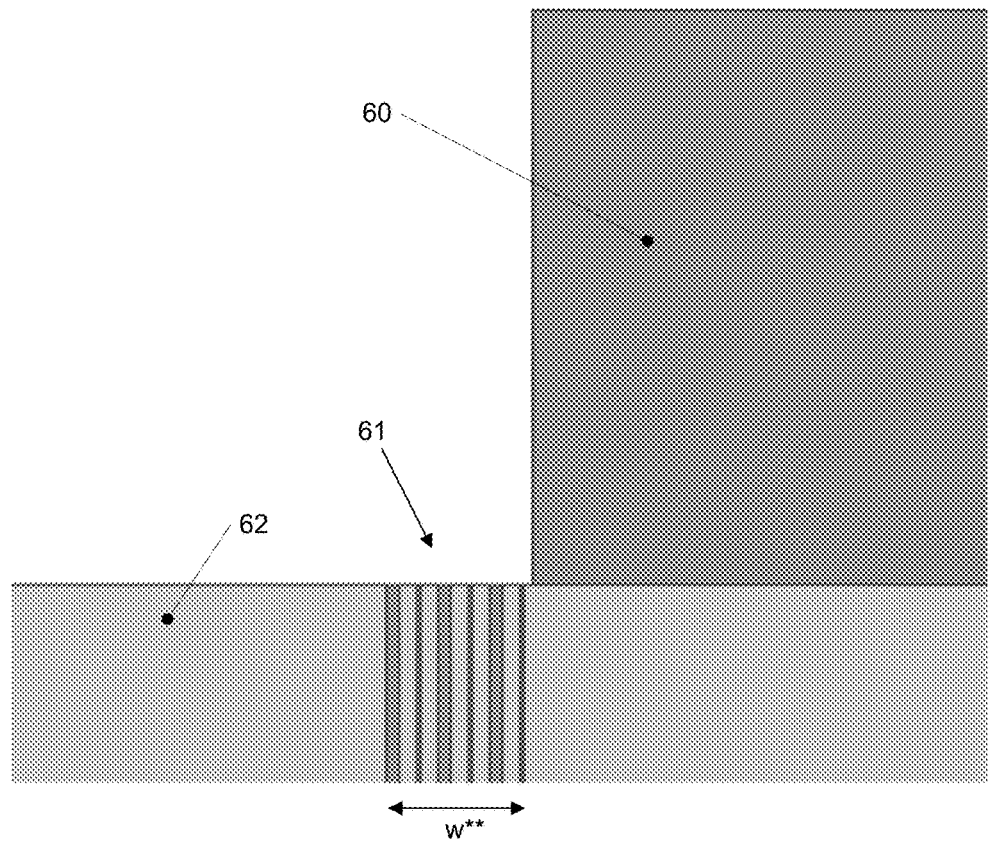
FIG. 6 is a cross-sectional view illustrating an alternative implementation of a resonator according to some embodiments.

FIG. 6 illustrates a variation of the embodiment of FIG. 5, the view of FIG. 6 corresponding to the cross-sectional view of FIG. 5C. In FIG. 6, a first electrode 60 which may correspond to first electrode 50 of FIG. 5 is provided on a piezoelectric material 62, which may correspond to piezoelectric material 52 of FIG. 5. A metamaterial 61 is provided around an active resonator region. In case of FIG. 6, metamaterial 61 has a width w** and comprises three unit cells of a metamaterial. The metamaterial of FIG. 6 may be based on the unit cell 30 of FIG. 3 with two different materials for the columns with radius r1 and the columns with radius r2. The two different materials moreover may be different from the material of first electrode 60. In other embodiments one of the two materials may correspond to the material of first electrode 60.

Figure 7:
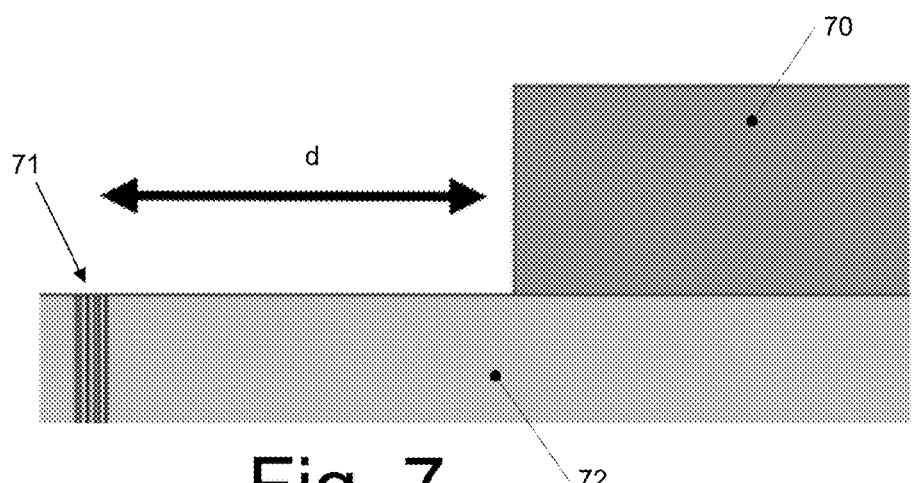
FIG. 7 is a cross-sectional view illustrating an alternative implementation of a resonator according to some embodiments.

FIG. 7 illustrates a further variation of the embodiment of FIG. 5, again showing a cross-sectional view similar to the view of FIG. 5C. In FIG. 7, a first electrode 70 is placed on a piezoelectric material 72. First electrode 70 and piezoelectric material 72 may be implemented as described referring to FIG. 1 or 5. In FIG. 7, a metamaterial 71, which may be implemented as explained referring to FIG. 5 or 6, is provided spaced apart by a distance d from top electrode 70. Distance d may for example be between 20 and 150 μm, for example between 50 and 120 μm, for example about 70 μm. This spacing apart is similar to the providing of region 15 in FIG. 1B.

Next, some simulation results for resonators according to embodiments will be described referring to FIGS. 8-10 to illustrate the effects of providing a metamaterial around a resonator further.

For simulations, a resonator having a structure similar to the ones discussed above with a piezoelectric material sandwiched between a first electrode and a second electrode was used. FIG. 8 shows illustrative admittance curves over frequency for two different resonators having different resonator thicknesses, i.e. thickness of piezoelectric material in the z-direction of FIG. 1, which essentially leads to a shifting of the curve with frequency. In particular, in FIG. 8 a curve 80 shows the admittance over frequency for a relatively thicker resonator, and a curve 81 shows the admittance for a relatively thinner resonator. As can be seen, spurious modes indicated by peaks 82, 83, 84, 85, for example, occur which at least in part are due to leakage of energy from the resonator.

FIG. 9 illustrates the resonator of FIG. 8 with a phononic crystal having two repetitions of a unit cell (similar to what is shown in FIG. 5) surrounding the active resonator region. It should be noted that apart from adding the phononic crystal, no other modifications (i.e. no modifications of lateral dimensions of material) were performed. A curve 90 illustrates the behavior for the relatively thicker resonator (corresponding to curve 80 in FIG. 8), and a curve 91 illustrates the behavior for the relatively thinner resonator (corresponding to curve 81 in FIG. 8). As can be seen only some spurious modes at 92, 93, 94 remain, which are considerably less pronounced than the ones shown in FIG. 8.

Figure 10:
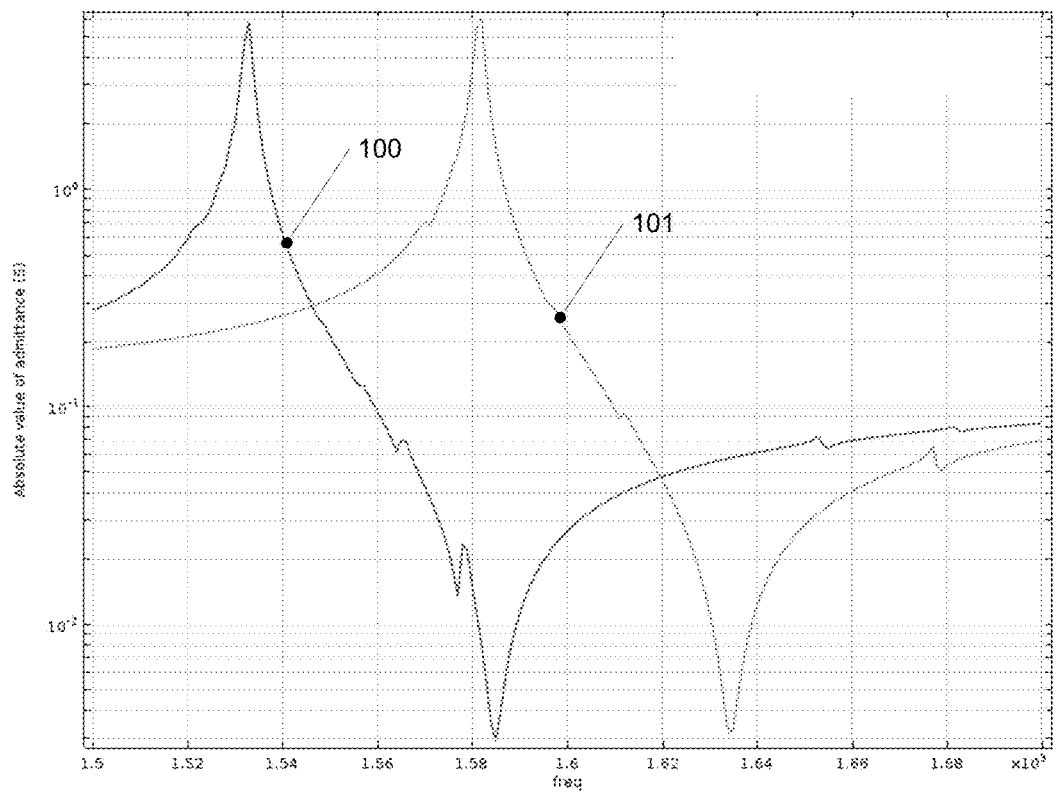

FIG. 10 illustrates a further simulation for a phononic crystal with three repetitions of a unit cell (similar to what is shown in FIG. 6) surrounding the active resonator region. Again, no other modifications were made. Also in this case, only some small spurious modes remain, but, compared to FIG. 9, the result is only a slight improvement. Therefore, while in embodiments a plurality of layers or repetitions of a phononic crystal structure may be provided, in many cases two repetitions of a unit cell or at most three repetitions are sufficient, and providing further repetitions does not necessarily improve the result, although nevertheless further repetitions may be provided.

Figure 11:
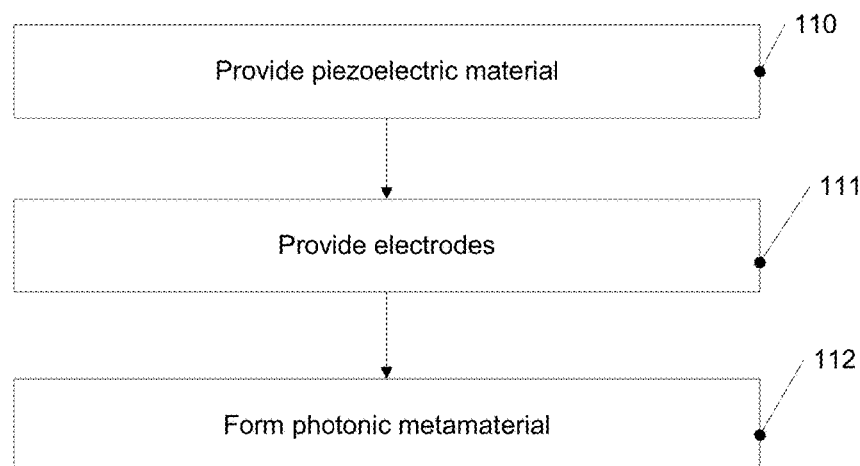
FIG. 11 is a flow chart illustrating a method according to an embodiment.

FIG. 11 is a flow chart illustrating a method according to an embodiment. While the method of FIG. 11 is illustrated as a series of acts or events, the order in which these acts or events are presented is not to be construed as limiting. In particular, the various processing steps to obtain a resonator which will now be explained referring to FIG. 11 may be performed in various orders. It should be noted that various acts and events may also be provided simultaneously.

The method of FIG. 11 may be used to manufacture a resonator as explained with reference to FIGS. 1-10, and for ease of illustration the method will be described referring to FIGS. 1-10. Details regarding materials, arrangements etc. described with respect to FIGS. 1-10 are also applicable to the method of FIG. 11.

At 110, the method of FIG. 11 comprises providing a piezoelectric material, for example piezoelectric material 10, 52, 62 or 72 of the above-described embodiments.

At 111, the method comprises providing electrodes, for example electrodes 11, 12 of FIG. 1 or electrodes 50, 53 of FIG. 5, on opposite sides of the piezoelectric material to form a resonator.

At 112, the method comprises forming an acoustic metamaterial surrounding an active resonator region, for example by incorporating material in a periodic fashion into the piezoelectric material, as explained. It should be noted that in cases where a material for the electrodes is the same as one of the materials forming the acoustic metamaterial, 111 and 112 may be performed essentially simultaneously, for example by first providing poles corresponding to columns to be formed in the piezoelectric materials and then depositing material for the electrodes on the electric material to form electrodes into the holes for forming the acoustic metamaterial. In other embodiments separate processing may be employed. The acoustic metamaterial may be formed as a phononic crystal with repeating unit cells, as discussed above.

Resonators as discussed above may for example be used in filter structures for communication devices like mobile network communication devices, but are not limited thereto.

In view of the many variations and modifications described above, it is evident that the above-described embodiments serve illustrative purposes only and are not to be construed as limiting.

The invention claimed is:

1. A filter, comprising:
a resonator, including:
a piezoelectric material;
a first electrode provided on a first side of the piezoelectric material;
a second electrode arranged on a second side of the piezoelectric material opposite the first side, a region formed between the first and second electrodes defining an active resonator region in the piezoelectric material; and
an acoustic metamaterial at least partially surrounding each side of the active resonator region, the acoustic metamaterial comprising a structure of at least one further material embedded in the piezoelectric material.

2. A resonator, comprising:
a piezoelectric material;
a first electrode provided on a first side of the piezoelectric material;
a second electrode arranged on a second side of the piezoelectric material opposite the first side, a region formed between the first and second electrodes defining an active resonator region in the piezoelectric material; and
an acoustic metamaterial at least partially surrounding each side of the active resonator region, the acoustic metamaterial comprising a structure of at least one further material embedded in the piezoelectric material.

3. The resonator of claim 2, wherein the acoustic metamaterial comprises a phononic crystal formed by a plurality of repetitions of a phononic crystal unit cell.

4. The resonator of claim 3, wherein the phononic crystal unit cell comprises at least one region of a second material provided in a first material.

5. The resonator of claim 4, wherein the at least one region of the second material comprises a column of the second material provided in the first material.

6. The resonator of claim 4, wherein the at least one region of the second material comprises at least two columns with different dimensions and/or shapes.

7. The resonator of claim 2, wherein the at least one further material associated with the acoustic metamaterial comprises a material comprised in the first or second electrode.

8. The resonator of claim 2, wherein the acoustic metamaterial is provided directly adjacent to the active resonator region.

9. The resonator of claim 2, wherein the acoustic metamaterial is provided spaced apart from the active resonator region.

10. The resonator of claim 2, wherein the acoustic metamaterial has an acoustic bandgap in a frequency range comprising a resonance frequency of the resonator.

11. The resonator of claim 2, wherein the acoustic metamaterial completely surrounds the active resonator region.

12. The resonator of claim 2, wherein a peripheral region of the first or second electrode comprises a modification compared to a remaining region of the first or second electrode, respectively.

13. The resonator of claim 12, wherein the modification of the peripheral region of the first or second electrode comprises a thickness variation or an additional material provided on the electrode.

14. The resonator of claim 2, wherein a peripheral region of the active resonator region comprises a modification compared to a remaining region of the active resonator region.

15. The resonator of claim 14, wherein the modification of the peripheral region of the active resonator region comprises a trench.

16. The resonator of claim 2, wherein the acoustic metamaterial extends within the piezoelectric material in a direction perpendicular to the first electrode and the second electrode.

17. The resonator of claim 16, wherein the acoustic metamaterial fully extends within the piezoelectric material from (i) a top surface of the piezoelectric material onto which the first electrode is disposed, to (ii) a bottom surface of the piezoelectric material onto which the second electrode is disposed.

18. A method, comprising:
providing a piezoelectric material;
providing first and second electrodes on opposite sides of the piezoelectric material, a region formed between the first and second electrodes defining an active resonator region in the piezoelectric material; and
forming an acoustic metamaterial comprising a structure of at least one further material embedded in the piezoelectric material, the acoustic metamaterial at least partially surrounding each side of the active resonator region.

19. The method of claim 18, wherein the forming the acoustic metamaterial comprises forming a periodic structure of at least one further material in said piezoelectric material.

20. The method of claim 18, further comprising:
manufacturing a resonator
including the piezoelectric material the first electrode, the second electrode, and
an acoustic metamaterial at least partially surrounding the active resonator region.

* * * * *